United States Patent
Goller et al.

(10) Patent No.: US 7,334,329 B2
(45) Date of Patent: Feb. 26, 2008

(54) METHOD FOR PRETREATING A PIEZOELECTRIC CERAMIC AND METHOD FOR ADJUSTING AN INJECTION VALVE

(75) Inventors: Matthias Goller, Bad Abbach (DE); Stefan Kohn, Hohenburg (DE); Wolfgang Reisinger, Regenstauf (DE); Andreas Voigt, Regensburg (DE); Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 465 days.

(21) Appl. No.: 10/903,724

(22) Filed: Jul. 30, 2004

(65) Prior Publication Data
US 2005/0017416 A1    Jan. 27, 2005

Related U.S. Application Data

(63) Continuation of application No. PCT/DE03/00262, filed on Jan. 30, 2003.

(30) Foreign Application Priority Data
Feb. 1, 2002   (DE) ............................. 102 04 047

(51) Int. Cl.
*H01L 41/22* (2006.01)
*B28B 1/00* (2006.01)

(52) U.S. Cl. ............... 29/888.42; 29/25.35; 123/498; 264/618

(58) Field of Classification Search ............ 29/888.41, 29/888.42, 890.12, 890.121, 25.35, 846; 310/330, 331, 332; 264/1, 21, 426, 430, 264/618; 123/498
See application file for complete search history.

(56) References Cited

U.S. PATENT DOCUMENTS

| | | | |
|---|---|---|---|
| 2,928,163 A | | 3/1960 | Berlincourt et al. ........ 29/25.35 |
| 4,062,790 A | * | 12/1977 | Nishida et al. ........ 252/62.9 PZ |
| 6,532,942 B2 | * | 3/2003 | Zumstrull ................ 123/498 |
| 6,561,436 B1 | * | 5/2003 | Boecking ................ 123/498 |
| 6,664,715 B2 | * | 12/2003 | Yamamoto et al. ......... 310/358 |
| 6,756,238 B2 | * | 6/2004 | Ogawa et al. ................ 438/3 |
| 6,887,397 B2 | * | 5/2005 | Yamaguchi et al. ... 252/62.9 R |

FOREIGN PATENT DOCUMENTS

| | | |
|---|---|---|
| DE | 1646551 | 10/1971 |
| DE | 2637951 A1 | 3/1977 |
| DE | 32 44526 A1 | 7/1983 |
| DE | 196 19 319 A1 | 11/1997 |
| DE | 197 56 182 A1 | 7/1999 |
| DE | 199 02 807 C1 | 6/2000 |
| DE | 100 39 641 A1 | 3/2001 |
| DE | 100 28 335 A1 | 2/2002 |
| EP | 0 485 995 A1 | 11/1991 |
| JP | 06151996 | 5/1994 |
| WO | WO 99/31739 | 6/1999 |
| WO | WO 01/23736 | 4/2001 |

* cited by examiner

*Primary Examiner*—David P. Bryant
*Assistant Examiner*—Alexander P Taousakis
(74) *Attorney, Agent, or Firm*—Baker Botts L.L.P.

(57) ABSTRACT

In a method for pretreating a piezoelectric ceramic (1) and a method for adjusting an injection valve (7), the piezoelectric ceramic (1) is exposed to environmental conditions, leading to a reduction of polarization and also a reduction of the length of the ceramic (1). The obtained length exhibits a greater long-term stability due to said adjusting phase. Consequently, the injection valve (7) can be re-adjusted before use. As a result, renewed adjustment thereof is required only after a long period in service.

22 Claims, 3 Drawing Sheets

Before polarization

During polarization

Extension with field applied

After polarization

Residual extension

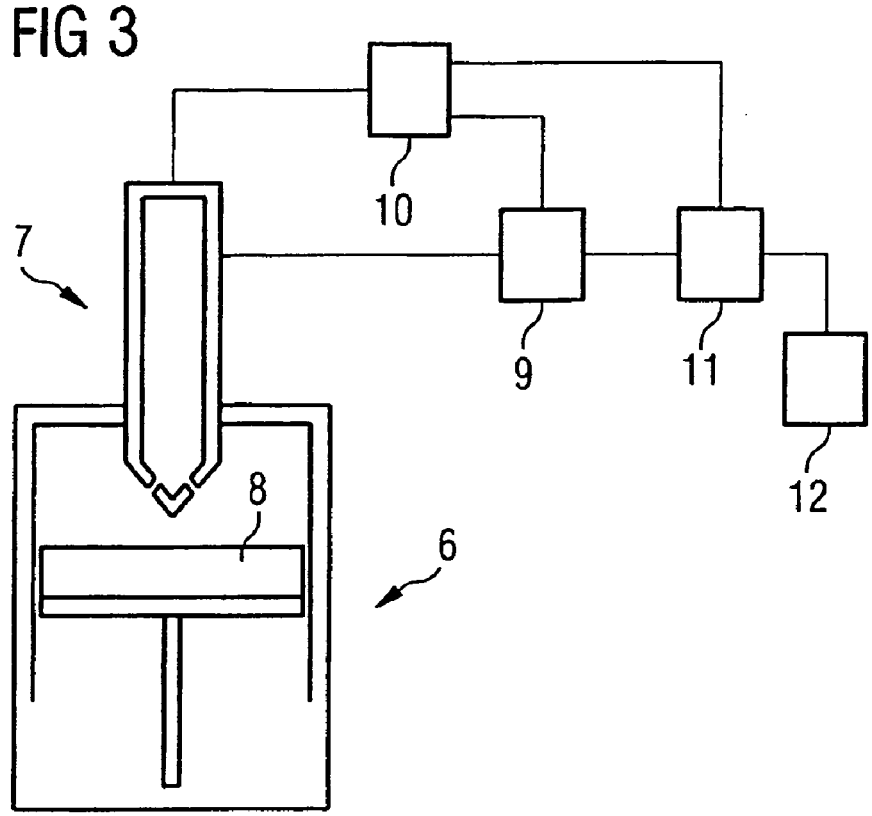
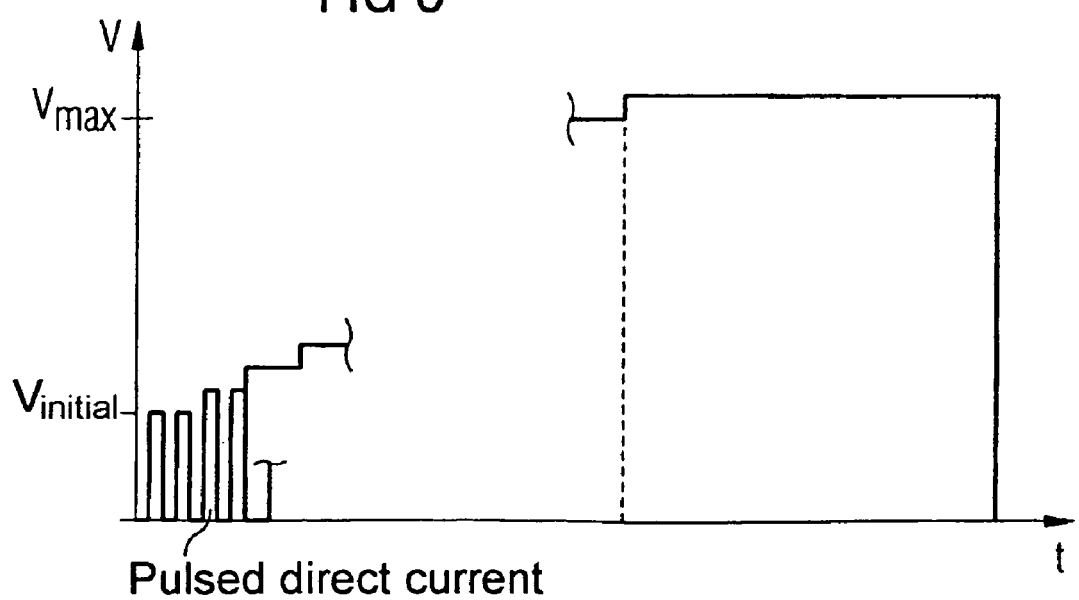

METHOD FOR PRETREATING A PIEZOELECTRIC CERAMIC AND METHOD FOR ADJUSTING AN INJECTION VALVE

CROSS REFERENCE TO RELATED APPLICATION

This application is a continuation of copending International Application No. PCT/DE03/00262 filed Jan. 30, 2003 which designates the United States, and claims priority to German application no. 102 04 047.8 filed Feb. 1, 2002.

TECHNICAL FIELD OF THE INVENTION

The present invention relates to a method for pretreating a piezoelectric ceramic and to a method for adjusting an injection valve comprising a piezoelectric actuator.

DESCRIPTION OF THE RELATED ART

Piezoelectric actuators are used in a variety of different areas of technology. In particular, piezoelectric actuators are used in modern injection valves in order to actuate control elements of the injection valve. Actuation of the control element starts and/or ends an injection process, for example.

Piezoelectric ceramics consist, for example, of lead zirconate-titanate ceramics and because of their piezoelectric effect have the advantage that the piezoelectric ceramic rapidly changes its length by a predetermined distance when a voltage is applied. The rapidity and the high forces, in particular, make the piezoelectric ceramic of interest for use in injection valves.

It has, however, been shown that in the course of time the piezoelectric ceramics alter their length when in a current-free state. Consequently, it is necessary in the case of injection valves, for example, to readjust play between the piezoelectric actuator and the control element after a predetermined period in service.

SUMMARY OF THE INVENTION

The object of the invention consists in providing a method for pretreating a piezoelectric ceramic which would ensure longer stability of the length of the ceramic.

The object of the invention consists furthermore in providing a method for adjusting an injection valve, after the implementation of which, a readjustment of the piezoelectric actuator in relation to an assigned control element is required only after a long period in service.

The objects of the invention can be achieved by a method for pretreating a piezoelectric ceramic which can be used for installing in an injection valve, comprising the step of subjecting the ceramic to a temperature treatment, wherein the temperature is set from 60° C. to 200° C. for a predeterminable period of time.

The period of time may amount to between 0.5 and 2.5 hours. The temperature may lie in the range from 60° C. to 180° C., and wherein polarization of the ceramic is then conducted. The ceramic can be mechanically prestressed during the temperature treatment. The ceramic can be subjected to a polarization process during the temperature treatment. The polarization can be conducted with a voltage of from 50 to 170 volts. The polarization can be conducted with a pulsed direct-current voltage. The polarization can be conducted with a frequency of from 20 to 120 Hz. The polarization can be conducted over a period of from 50 to 150 seconds. With increasing time the voltage can be increased from an initial value to a maximum value, and the maximum voltage can be held constant for a predetermined period of time.

The objects of the invention can also be achieved by a method for adjusting an injection valve, wherein the injection valve has a piezoelectric actuator, the actuator having a defined position or prestress in relation to a control element of the injection valve, comprising the steps of operating the injection valve in an adjustment phase at least with one parameter which occurs when an internal combustion engine is running, and setting the actuator after the adjustment phase to a defined position or prestress.

The injection valve can be installed in an internal combustion engine, and the injection valve can be used in the adjustment phase for injecting fuel. The injection valve can be connected to a fuel reservoir, the fuel reservoir may hold fuel ready at a predeterminable pressure for injecting and the pressure may lie preferably in a range which corresponds to a maximum range when the internal combustion engine is running. The actuator for injecting fuel can be driven with a high frequency which corresponds to a high engine speed of the internal combustion engine. The internal combustion engine can be run at a temperature, in particular in the region of the ceramic, which lies in the mean to upper temperature range of the temperatures occurring when the internal combustion engine is running.

An advantage of the invention in accordance with the present invention consists in the fact that the long-term stability of the length of the ceramic is improved by a temperature treatment, wherein the temperature lies in the range from 60° C. to 200° C. for a predetermined period of time. Trials have shown that the long-term stability of the length of the ceramic is increased by the temperature treatment. Depending on the embodiment of the method according to the invention, the temperature treatment can be conducted before or even during a first polarization process. By means of the polarization process, alignment of the magnetic orientation of the ceramic microstructure is achieved, an electric field being applied to the ceramic, which electric field is greater than the coercive field strength of the ceramic.

The temperature treatment is preferably conducted for a period of from 0.5 to 2.5 hours.

Good results have been shown by a method in which the temperature lies in the range from 60° C. to 180° C. and the electric polarization of the ceramic is conducted after the temperature treatment, since the polarization is required for each ceramic in order to generate the piezoelectric property of the ceramic.

Furthermore, it has proven advantageous to prestress the ceramic mechanically during the temperature treatment. The influence of a mechanical stress also brings about an increase in the long-term stability of the length of the ceramic.

An improvement in the method according to the invention is achieved by the ceramic being electrically polarized during the temperature treatment. The polarization is preferably conducted using a voltage of from 50 to 170 volts. Furthermore, polarization with a pulsed direct-current voltage also produces positive effects on the long-term stability of the length of the ceramic. Frequencies in the range from 20 to 120 Hz have proven advantageous in this respect.

Good results are achieved if the polarization is conducted for a period of from 50 to 51 seconds.

It is also advantageous in the polarization process to increase the voltage in a ramp with increasing voltage up to a maximum value. In addition, it is advantageous to hold the maximum voltage constant for a predetermined period of time. This measure also has an advantageous effect on the long-term stability of the length of the piezoelectric ceramic.

A substantial advantage of the inventive method according to claim 11 consists in the piezoelectric ceramic being constructed in the form of a piezoelectric actuator in an injection valve, the actuator being adjusted to a defined position or prestress in relation to a control element assigned to the actuator and the injection valve being operated in an adjustment phase at least with one parameter which corresponds to a parameter which occurs when the internal combustion engine is running normally. After the adjustment phase, the actuator is adjusted anew to the defined position or prestress. Consequently, an adjustment of the actuator is achieved before the injection valve is put into operation, which guarantees the long-term stability of the adjustment. Through the adjustment phase an ageing-dependent jigging action, in which the ceramic contracts, is preferred. Through the adjustment phase the ceramic is preferably brought into a balance which corresponds to the later operating conditions. In this way, temporarily occurring changes in the length of the piezoelectric ceramic are anticipated. Consequently, the injection valve is optimally adjusted for a longer period of service.

A particularly simple adjustment method is achieved by the injection valve being installed in an internal combustion engine and the injection valve being used in the adjustment phase for injecting fuel. The injection valve is consequently adjusted in an environment and with operating parameters which correspond to those pertaining in the subsequent operation of the injection valve. Consequently, an optimum adjustment to parameters and the subsequent environmental conditions can be achieved. In addition, it is not necessary to provide a special adjustment assembly. Any commercially available internal combustion engine can be used for this purpose.

In a preferred embodiment, the injection valve is connected to a fuel reservoir and the fuel reservoir holds fuel ready for the injection valve at a predeterminable pressure for injecting. Consequently, the influence of the fuel pressure is also taken into account in the adjustment phase. The fuel is preferably held ready at a pressure which lies in the region of the maximum pressure when the internal combustion engine is running normally. Modern common-rail injection systems exhibit maximum fuel pressures in the range from 1,400 to 2,000 bar. By using the maximum pressure, a very high loading of the ceramic is achieved. For example, the actuator opens a closing element against the pressure of the fuel.

The internal combustion engine is preferably operated at a temperature which lies, in particular in the area of the piezoelectric ceramic, in a mean to upper temperature range of the temperatures which can occur when the internal combustion engine is running. Consequently, the influence of the temperature which affects the ceramic during the running of the internal combustion engine is also taken into account in the adjustment phase. This also contributes to the long-term stability of the length of the ceramic.

BRIEF DESCRIPTION OF THE DRAWINGS

The invention is described in detail below with reference to the Figures in which FIG. 3 shows an injection device with an internal combustion engine, FIG. 5 shows a voltage ramp for a polarization process.

DETAILED DESCRIPTION OF THE PREFERRED EMBODIMENTS

Figure 1:
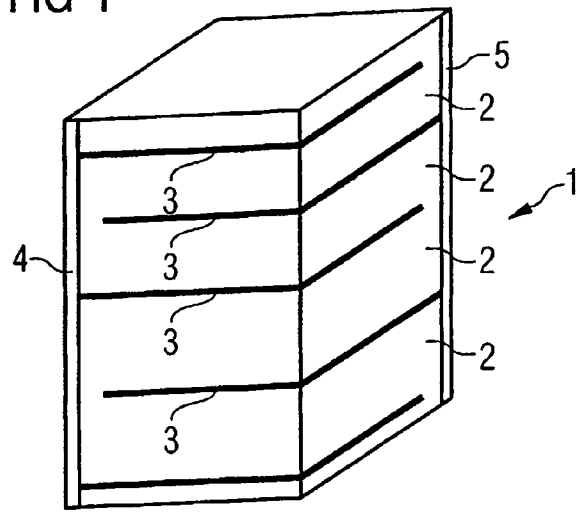
FIG. 1 shows a diagrammatic representation of a piezoelectric ceramic.

FIG. 1 shows a piezoelectric ceramic 1 which is constructed in the form of stacked ceramic layers 2. The ceramic layers 2 are separated from one another by an electrically conductive plane 3. To form the electrically conductive planes 3, layers are used, consisting for example of silver. The planes 3 are applied in the form of a screen print of silver preparations in paste form. After production of the piezoceramic stack, which consists of the ceramic layers 2 and the electrically conductive planes 3, the stack is subjected to a stoving process from 500° C. to 800° C. In this process, metallic silver is produced from the silver compound, said silver producing, after the piezostack has cooled down, a rigid connection with the piezoceramic base. The planes 3 are in each case connected alternately to a first or second conduction band 4, 5. The conduction bands 4, 5 are arranged in diametrally arranged corner areas of the piezoceramic 1, which is designed square in cross-section. The conduction bands 4, 5 are supplied with variable voltage for activating the ceramic so that an electric field forms in each case between two adjacent planes 3. The electric field results in deformations of the ceramic layer 2. The deformations of the ceramic layers 2 accumulate and thus lead to a change in the length of the piezoelectric ceramic 1. The deformation change of the ceramic layer 2 is proportional to the electric-field strength which acts upon the ceramic layer 2.

Figure 2A:
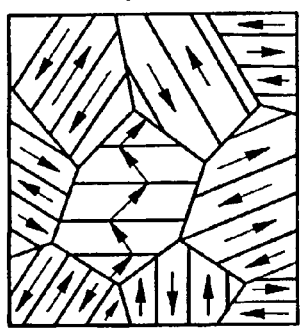
FIG. 2 shows polarity structures of a piezoceramic before and after polarization.

Piezoelectric ceramics are special ferroelectrics whose behavior in the electric field determines the piezoelectricity. Lead zirconate-titanate ceramics (Pb (Ti, Zr) $O_3$), for example, are suitable for producing the ceramic layers 2. The polarization effects in ferroelectric ceramics arise out of the particular characteristics of the ceramic microstructure when spontaneous polarization occurs. As a result of the production process, which is designed, for example, in the form of a sintering process, each crystalline grain of the ceramic layer 2 is surrounded by other grains. At the temperature of conversion into a ferroelectric state, each grain is, as a consequence of electrostrictive effects, spontaneously deformed in a similar way to a single crystal. In this process, however, each grain is impeded by adjacent grains so that internal stresses can in part be reduced only by splitting a grain into domains. The microstructure of the ferroelectric ceramic after synthesis and cooling below the Curie temperature is still isotropic. That is, the magnetic dipole moments of the grains are compensated because of the statistical distribution of the directions of polarization. This state is shown in FIG. 2A.

Figure 2B:
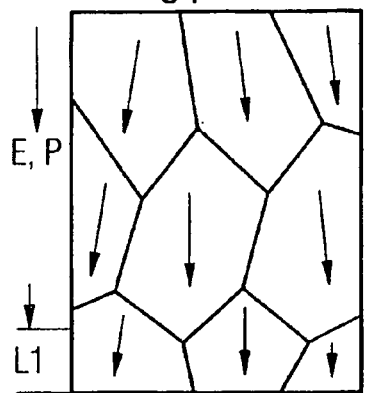

In order to produce a piezoelectric ceramic, the ceramic is subjected to a polarization process. The polarization process serves to set a residual polarization of the ceramic. In polarization, a large direct-current electric field is created. The electric-field strength here must lie above a coercive field strength of the ceramic material of the ceramic layer 2. In the material, which is until then isotropic, extensive alignment of the ferroelectric domains occurs, as shown in FIG. 2B.

Figure 2C:
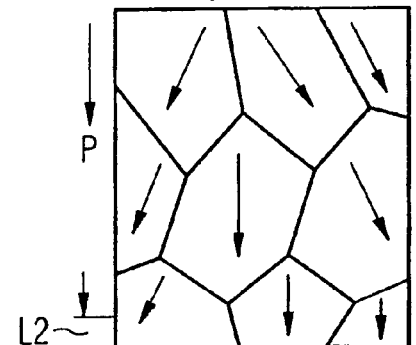

For different compositions, the required field strength can be highly variable. The value depends on the mobility of the ferroelectric domains, i.e. on how easily the ferroelectric domains are to align. With increasing temperature, the polarization field strength required broadly decreases and polarization proceeds more or less according to the duration of action of the electric field. FIG. 2B shows diagrammatically a ceramic layer 2 during the polarization process. Here the ceramic layer 2 extends by a first length L1. In addition, the dipole moments of the ferroelectric domains are aligned. After the end of the polarization process, the length of the ceramic is reduced, but remains longer than before the polarization process by a second length L2. This state is shown in FIG. 2C. A residual polarization of the ceramic thus remains. The residual polarization, which influences the length of the polarized ceramic and the piezoelectric effects, decreases over time. The polarization determines the piezoelectric, elastic or dielectric properties of the ceramic layer.

The methods according to the invention lead to the residual polarization being brought to a value which has greater long-term stability. It is taken into account here that the ceramic 1 will possibly contract further or even exhibit altered piezoelectric, elastic or dielectric properties.

FIG. 3 shows a diagrammatic representation of an internal combustion engine 6 to which an injection valve 7 is assigned. The injection valve 7 projects into a combustion chamber of a cylinder which is sealed by a movable piston 8. The injection valve 7 is connected via a fuel line to a fuel reservoir 9 which holds fuel ready for the injection valve 7 under a predetermined pressure for injecting. The injection valve 7 is connected via a control line to a control device 10. The control device 10 is additionally connected via a second control line to a regulating valve of the fuel reservoir 9. Furthermore, the control device 10 is preferably connected via a third control line to a pump 11 which feeds fuel from a tank 12 under high pressure to the fuel reservoir 9. For injecting fuel, the injection valve 7 is controlled by the control device 10. In addition, the control device 10 records operating parameters of the internal combustion engine, in particular the load and/or the engine speed.

The control device 10 has a memory in which control programs for controlling the injection valve are filed. Furthermore, programs are filed which control the adjustment of the fuel pressure in the fuel reservoir 9 either via a pressure-regulating valve of the fuel reservoir 9 or via regulation of the delivery rate of the pump 11.

Figure 4:
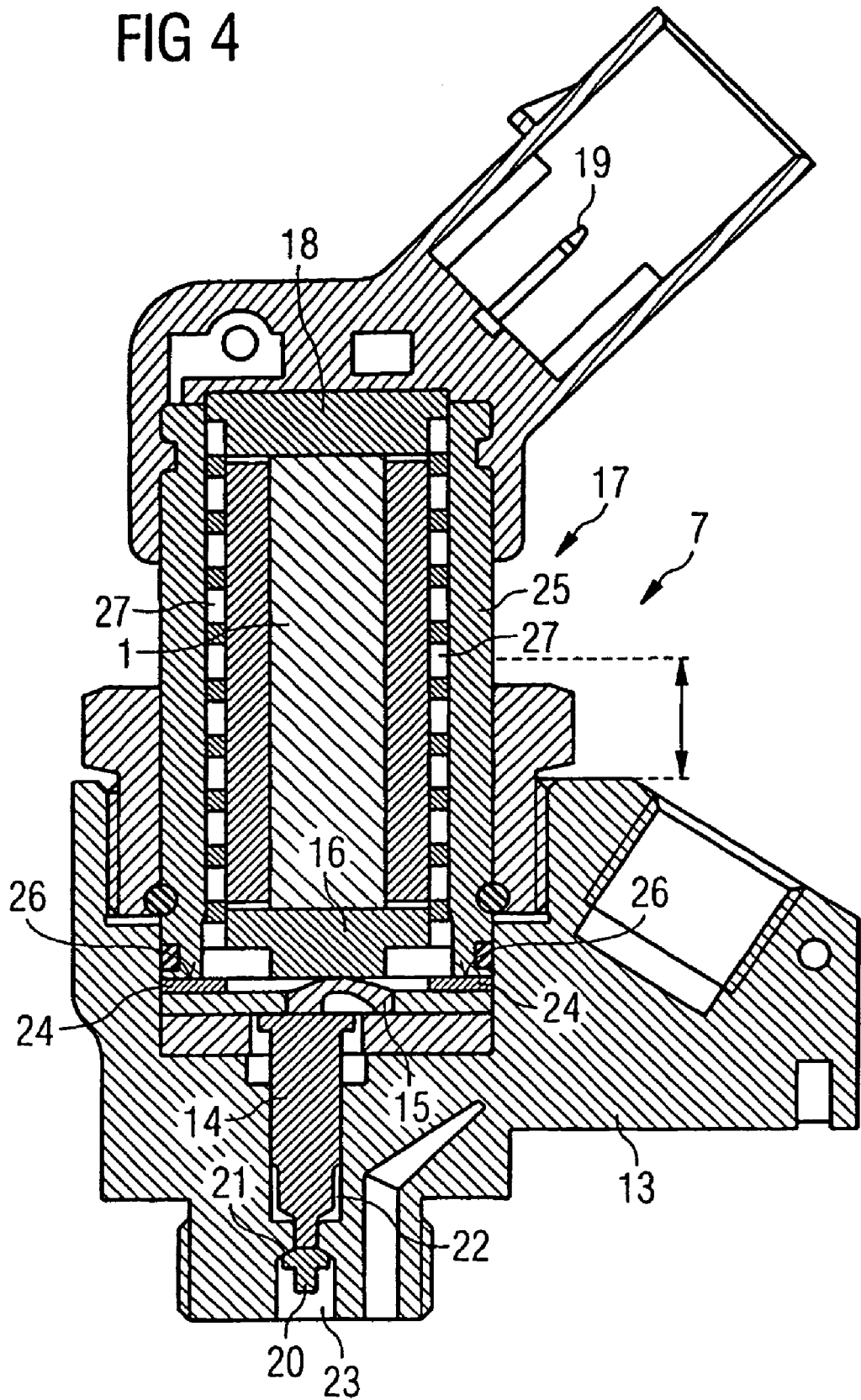
FIG. 4 shows a cross-section through a part of an injection valve.

FIG. 4 shows a section of the injection valve 7 which shows a housing 13 in which a control element 14 is movably arranged. The control element 14 is operatively connected via the lever 15, supported on one side, to an actuator plate 16 of the piezoelectric actuator 17. The actuator 17 consists essentially of the ceramic 1 which is clamped between the actuator plate 16 and a top plate 18. The top plate 18 and the actuator 17 are prestressed against one another by means of a sleeve-shaped Bourdon tube 27. In this way, the ceramic 1 is subjected to mechanical prestressing. The ends of the ceramic 1 are compressed by the actuator plate 16 and the top plate 18 with a predetermined prestressing force. The top plate 18 is rigidly connected to an upper end region of an actuator housing 25 in which the actuator 17 is placed. The actuator housing 25 is screwed via a screw connection to the housing 13. On a bearing surface of the housing 13 lies one end area of a lever 15. The other end area of the lever 15 lies on a bearing surface of the control element 14. One bearing surface of the lever 15 is assigned to the actuator plate 16. A spacing is preferably designed between the bearing surface of the lever 15 and the actuator plate, referred to as play. Depending on the embodiment, the actuator plate can also be prestressed with a desired prestress against the lever and thus against the control element 14.

The conduction bands 4, 5 (FIG. 1) of the ceramic 1 are connected via electric lines 19 to the control device 10. The control device 10 adjusts, by means of the appropriate supply of current through the electric lines 19, the length of the piezoelectric ceramic and thus the position of the actuator plate 16. Consequently, when current is applied to the ceramic 1 the actuator plate 16 changes its position relative to the lever 15. Thus, depending on the deviation of the ceramic 1, the lever 15 is pressed downward on the control element 14. The control element is also pressed downward by this means.

In this exemplary embodiment, the control element 14 is assigned to a closing element 20. When current is applied to the ceramic 1, the closing element 20 is lifted by the control element 14 from an assigned sealing seat 21. As a consequence of this, a drain 22 is connected to a control chamber 23. The pressure in the control chamber 23 acts upon an injection needle. The pressure in the control chamber 23 prestresses the injection needle on to a needle seat. Furthermore, the injection needle is loaded via thrust faces with the same fuel pressure which, however, wants to lift the injection needle from the needle seat. Consequently, if the closing element 20 is lifted from the sealing seat 21 via actuation of the control element 14, then the pressure in the control chamber 23 falls and the injection needle is lifted from the sealing seat by the fuel pressure which continues to act upon the thrust faces. Consequently, an injection of fuel into the combustion chamber of the internal combustion engine 6 begins. If current is removed from the ceramic, then the ceramic 1 contracts. Consequently, the actuator 17 no longer exerts force on the control element 14 and the closing element 20. The consequence is that the closing element 20 is pressed by the fuel pressure of the control chamber 23 back onto the sealing seat 21. The drain 22 is thereby closed. The pressure in the control chamber 23 rises again and the injection needle 7 is pressed onto the needle seat. The injection of fuel into the combustion chamber is thereby terminated.

The distance between the actuator plate 16 and the lever 15 is determined by the screw-in depth of the actuator housing 25. An adjusting disc 24 is placed between a supporting surface 26 of the actuator housing and the housing 13, said adjusting disc determining a setpoint distance, i.e. play, or a defined prestress between the actuator plate 16 and the lever 15. The choice of thickness of the adjusting disc 24 simultaneously determines the play or the prestress between the piezoelectric actuator and the control element 14.

If, because of ageing symptoms, contraction of the ceramic 1 occurs, then readjustment of the actuator plate 16 in relation to the lever 15 or to the control element 14 is required. To this end, a thicker or thinner adjusting disc, for example, can be inserted and the actuator housing 25 screwed in to the appropriate distance from the housing 13. A small change in the play or prestress is also achieved, for example, by a change in the torque with which the actuator housing is screwed into the housing 13.

In place of the embodiment described, the piezoelectric actuator can, for example, also actuate directly the injection needle or any other control element.

To achieve great long-term stability of the length of the ceramic 1, it has proven advantageous to subject the piezoelectric ceramic to a temperature treatment. Here the ceramic is exposed to a temperature in the range from 60° C.

to 200° C. for a predetermined period of time. By preference, a period of time ranging from 0.5 to 2.5 hours has proven advantageous.

A further improvement of the method according to the invention is achieved by the temperature lying in the range from 60° C. to 180° C. and the temperature treatment being conducted before electric polarization of the ceramic.

It is also advantageous to prestress the ceramic 1 mechanically during the temperature treatment. Here the ceramic 1 can for example already be clamped between the actuator plate 16 and the top plate 18 via the sleeve-shaped Bourdon tube 27. However, any other type of clamping device with which the two end faces of the ceramic 1 can be prestressed against one another can be used.

Furthermore, it can also be advantageous to conduct the polarization process during the temperature treatment and preferably during mechanical prestressing.

For polarization, a voltage is used which preferably lies in the range from 50 V to 170 V. Good results have been produced in a polarization process with a pulsed direct-current voltage. Here, the direct-current voltage is in each case applied for a predetermined period of time, then reduced to 0 volts for a further period and the direct-current voltage is then re-applied.

The pulsed direct-current voltage is preferably implemented in polarization with a frequency of from 20 to 120 Hz. Very good results have been achieved with a frequency of 100 Hz.

A very good temperature range lies between 80° C. and 100° C. Similarly, for relatively good long-term stability, a period of 1 hour is sufficient for the temperature treatment. Good results are also achieved with a temperature from 80° C. to 130° C.

If the temperature treatment is conducted before polarization, good results are obtained in a temperature range from 80° C. to 180° C.

For the period of polarization a time range from 50 to 150 seconds has proven advantageous. This time period is usually sufficient for obtaining adequate permanent polarization of the ceramic.

FIG. 5 shows a diagram which represents a voltage curve during polarization. Polarization is started with an initial voltage in the region of 60 V, the voltage being increased as time increases in steps of 1 to 2 V up to a maximum voltage of approximately 160 V. This increase of voltage takes place over a period of from 60 to 80 seconds. The maximum voltage is then held constant for a period of from 150 to 170 seconds, preferably 160 seconds. In this polarization process, a static temperature is preferably adhered to which lies in the range from 60° C. to 150° C. After termination of the polarization process, an improvement is obtained in the long-term stability of the length of the ceramic 1. The switch of pulsed voltage described above is preferably superimposed on the level of direct-current voltage. The voltage thus swings in the polarization process to and fro between the magnitudes shown in FIG. 5 and zero. The pulsed direct-current voltage preferably exhibits a square-shaped voltage curve, as represented diagrammatically in FIG. 5.

A particularly advantageous embodiment of the method according to the invention consists in installing the injection valve in an internal combustion engine in accordance with FIG. 3 and in operating in the constructed state the injection valve with at least one parameter which occurs during operation of the internal combustion engine. After the adjustment phase, the piezoelectric actuator 17 is adjusted anew to a predetermined position or prestress relative to a control element 14. Only after the adjustment phase is the injection valve used for normal operation of the internal combustion engine.

The internal combustion engine in which the injection valve is installed during the adjustment phase can either be a special internal combustion engine which is used only for adjustment phases or else the internal combustion engine in which the injection valve is to be deployed in later operation can be used.

An essential parameter when adjusting the injection valve is represented by a counterpressure which is exerted on the ceramic when controlled by the control device. The counterpressure can, for example, be represented by an appropriate device or by the actual situation in the internal combustion engine. In the embodiment in FIG. 3 and FIG. 4, the counterpressure is achieved through the control element 14 and the closing element 20. The closing element 20 transfers the fuel pressure of the control chamber 23 via the control element 14, the lever 15 and the actuator plate 16 to the ceramic 1. In this way, a pressure acts upon the ceramic 1 which also occurs in normal running of the internal combustion engine. Consequently, optimum adjustment is also achieved in relation to the counterpressure.

In the adjustment phase, a fuel pressure is preferably used which lies in the upper, i.e. maximum range of the possible fuel pressure. Consequently, a high loading of the ceramic 1 is achieved and thus a relatively large jigging action exerted on the ceramic 1. This causes the ceramic 1 to exhibit very high long-term stability in terms of length.

Also in the adjustment phase in the internal combustion engine, a temperature which lies in the upper temperature range of the temperatures normally occurring during operation of the internal combustion engine is exerted on the ceramic 1. Consequently, a strong effect on the ceramic 1 is also achieved in terms of the temperature. This effect also leads to a heavy loading of the ceramic 1 and thus to a large jigging action. The ceramic 1 thus contracts relatively severely. However, this brings about very high long-term stability of the length of the ceramic 1.

In the adjustment phase the internal combustion engine 6 is preferably run at a high speed so that the ceramic is controlled by means of a high frequency to extend and contract. A strong jigging action is thus exerted on the ceramic.

The process steps described can be deployed both in combination and individually. Both the process steps in respect of the injection valve and the process steps in respect of the piezoceramic can be combined with one another.

We claim:

1. A method for pretreating a piezoelectric ceramic which can be used for installing in an injection valve, comprising the steps of:
    providing a piezoelectric ceramic stack;
    subjecting the piezoelectric ceramic stack to a temperature treatment, wherein the temperature is set from 60° C. to 200° C. for a first predeterminable period of time; and
    during the temperature treatment subjecting the piezoelectric ceramic stack to a polarization process during which with increasing time a polarization voltage applied to the piezoelectric ceramic stack is increased from an initial value to a maximum value.

2. The method according to claim 1, wherein the first period of time amounts to between 0.5 and 2.5 hours.

3. The method according to claim 1, wherein the temperature lies in the range from 60° C. to 180° C.

4. The method according to claim 1, wherein the piezoelectric ceramic stack is mechanically prestressed during the temperature treatment.

5. The method according to claim 1, wherein the polarization is conducted with a voltage of from 50 to 170 volts.

6. The method according to claim 5, wherein the polarization is conducted with a pulsed direct-current voltage.

7. The method according to claim 6, wherein the polarization is conducted with a frequency of from 20 to 120 Hz.

8. The method according to claim 5, wherein the polarization is conducted over a period of from 50 to 150 seconds.

9. The method according to claim 5, wherein the maximum voltage is held constant for a second predetermined period of time.

10. The method according to claim 1, wherein the injection valve has a piezoelectric actuator comprising the piezoelectric ceramic stack, the actuator having a defined position or prestress in relation to a control element of the injection valve, further comprising the steps of:
operating the injection valve in an adjustment phase at least with one parameter which occurs when an internal combustion engine is running; and
setting the actuator after the adjustment phase to a defined position or prestress.

11. The method according to claim 10, wherein the injection valve is installed in an internal combustion engine, and the injection valve is used in the adjustment phase for injecting fuel.

12. The method according to claim 10, wherein the injection valve is connected to a fuel reservoir, the fuel reservoir holds fuel ready at a predeterminable pressure for injecting and the pressure lies preferably in a range which corresponds to a maximum range when the internal combustion engine is running.

13. The method according to claim 10, wherein the actuator for injecting fuel is driven with a high frequency which corresponds to a high engine speed of the internal combustion engine.

14. The method according to claim 10, wherein the internal combustion engine is run at a temperature, in particular in the region of the piezoelectric ceramic stack, which lies in the mean to upper temperature range of the temperatures occurring when the internal combustion engine is running.

15. A method for pretreating a piezoelectric ceramic which can be used for installing in an injection valve, comprising the steps of:
providing a piezoelectric ceramic stack;
subjecting the piezoelectric ceramic stack to a temperature treatment, wherein the temperature is set from 60° C. to 200° C. for a first predeterminable period of time; and
subsequently subjecting the piezoelectric ceramic stack to a polarization process during which with increasing time a polarization voltage applied to the piezoelectric ceramic stack is increased from an initial value to a maximum value.

16. The method according to claim 15, wherein the first period of time amounts to between 0.5 and 2.5 hours and the temperature lies in the range from 60° C. to 180° C.

17. The method according to claim 15, wherein the piezoelectric ceramic stack is mechanically prestressed during the temperature treatment.

18. The method according to claim 15, wherein the polarization is conducted with a voltage of from 50 to 170 volts.

19. The method according to claim 15, wherein the polarization is conducted with a pulsed direct-current voltage having a frequency of from 20 to 120 Hz.

20. The method according to claim 15, wherein the polarization is conducted over a period of from 50 to 150 seconds.

21. The method according to claim 15, wherein the maximum voltage is held constant for a second predetermined period of time.

22. The method according to claim 15, wherein the injection valve has a piezoelectric actuator comprising the piezoelectric ceramic stack, the actuator having a defined position or prestress in relation to a control element of the injection valve, further comprising the steps of:
operating the injection valve in an adjustment phase at least with one parameter which occurs when an internal combustion engine is running; and
setting the actuator after the adjustment phase to a defined position or prestress.

* * * * *